US012749515B2

(12) United States Patent
Jefremow et al.

(10) Patent No.: US 12,749,515 B2
(45) Date of Patent: Sep. 29, 2026

(54) MEMORY READOUT CIRCUIT

(71) Applicant: Infineon Technologies AG, Neubiberg (DE)

(72) Inventors: Mihail Jefremow, Augsburg (DE); Thomas Kern, Aschheim (DE); Arndt Voigtlander, Antdorf (DE)

(73) Assignee: Infineon Technologies AG, Neubiberg (DE)

( * ) Notice: Subject to any disclaimer, the term of this patent is extended or adjusted under 35 U.S.C. 154(b) by 134 days.

(21) Appl. No.: 18/782,285

(22) Filed: Jul. 24, 2024

(65) Prior Publication Data

US 2025/0037745 A1 Jan. 30, 2025

(30) Foreign Application Priority Data

Jul. 28, 2023 (DE) ..................... 10 2023 120 085.2

(51) Int. Cl.
*G11C 7/10* (2006.01)
*G11C 7/22* (2006.01)

(52) U.S. Cl.
CPC .............. *G11C 7/1069* (2013.01); *G11C 7/22* (2013.01)

(58) Field of Classification Search
CPC ........... G11C 7/1069; G11C 7/22; G11C 7/12; G11C 2207/063; G11C 7/062; G11C 7/067; G11C 7/08; G11C 13/004; G11C 16/26
USPC .................................................... 365/189.15
See application file for complete search history.

(56) References Cited

U.S. PATENT DOCUMENTS

2012/0126783 A1 5/2012 Jefremow et al.
2016/0125939 A1 * 5/2016 Park .................... G11C 11/5678 365/148
2016/0148668 A1 * 5/2016 Song ........................ G11C 7/02 365/222

FOREIGN PATENT DOCUMENTS

DE 102011118792 A1 7/2012
DE 102016125489 A1 6/2018

* cited by examiner

*Primary Examiner* — Fernando Hidalgo
(74) *Attorney, Agent, or Firm* — Eschweiler & Potashnik, LLC

(57) ABSTRACT

One embodiment describes a memory readout circuit. The memory readout circuit includes a readout node having a capacitance that is discharged by the memory cell to read out a memory cell by means of a cell current, a level detector that is configured to provide a digital output signal and to switch over the output signal when the potential of the readout node (due to the discharge of the readout node) crosses a switching threshold (depending on the selection of the level and the polarity downward or upward, that is to say the switching threshold is overshot or undershot), and a control circuit that is configured to set the switching threshold and/or the switching speed of the level detector depending on the cell current.

20 Claims, 11 Drawing Sheets

MEMORY READOUT CIRCUIT

REFERENCE TO RELATED APPLICATIONS

This application claims priority to German Patent Application 10 2023 120 085.2, filed on Jul. 28, 2023, the contents of which are hereby incorporated by reference in their entirety.

TECHNICAL FIELD

Exemplary embodiments generally relate to memory readout circuits.

BACKGROUND

In a semiconductor memory, a decision as to whether a memory cell stores a 0 or a 1 is typically made on the basis of a read current, which is supplied by the memory cell. For this purpose, the read current is compared with a reference, for example by virtue of the read current discharging a pre-charged capacitance and the voltage at the capacitance being compared with a reference voltage. In this way, the read current is converted into a digital signal that has an edge whose temporal position depends on the intensity of the read current. Here, there is a trade off in the fact that, on the one hand, the temporal position of the edge when the memory cell stores a 0 is to be sufficiently different from the temporal position of the edge when the memory cell stores a 1 in order to enable robust readout and, on the other hand, however, it should be possible to read out the memory as quickly as possible. Memory readout circuits that enable these two requirements to be met are desirable.

SUMMARY

One embodiment provides a memory readout circuit, comprising a readout node having a capacitance that is discharged by the memory cell to read out a memory cell by means of a cell current, a level detector that is configured to provide a digital output signal and to switch over the output signal when the potential of the readout node (due to the discharge of the readout node) crosses a switching threshold (depending on the selection of the level and the polarity downward or upward, that is to say the switching threshold is overshot or undershot), and a control circuit that is configured to set the switching threshold and/or the switching speed of the level detector depending on the cell current.

BRIEF DESCRIPTION OF THE DRAWINGS

The figures do not reflect the actual proportions but are intended to illustrate the principles of the various exemplary embodiments. Various exemplary embodiments are described in detail below with reference to the following figures.

DETAILED DESCRIPTION

The following detailed description relates to the attached figures, which show details and exemplary embodiments. These exemplary embodiments are described in such great detail that a person skilled in the art is able to carry out the invention. Other embodiments are also possible and the exemplary embodiments may be modified in structural, logic and electrical terms without departing from the subject matter of the invention. The various exemplary embodiments are not necessarily mutually exclusive; rather, various embodiments may be combined with one another to produce new embodiments. Within the scope of this description, the terms “linked”, “connected” and “coupled” are used to describe both a direct and an indirect link, a direct or indirect connection, and direct or indirect coupling.

Figure 1:
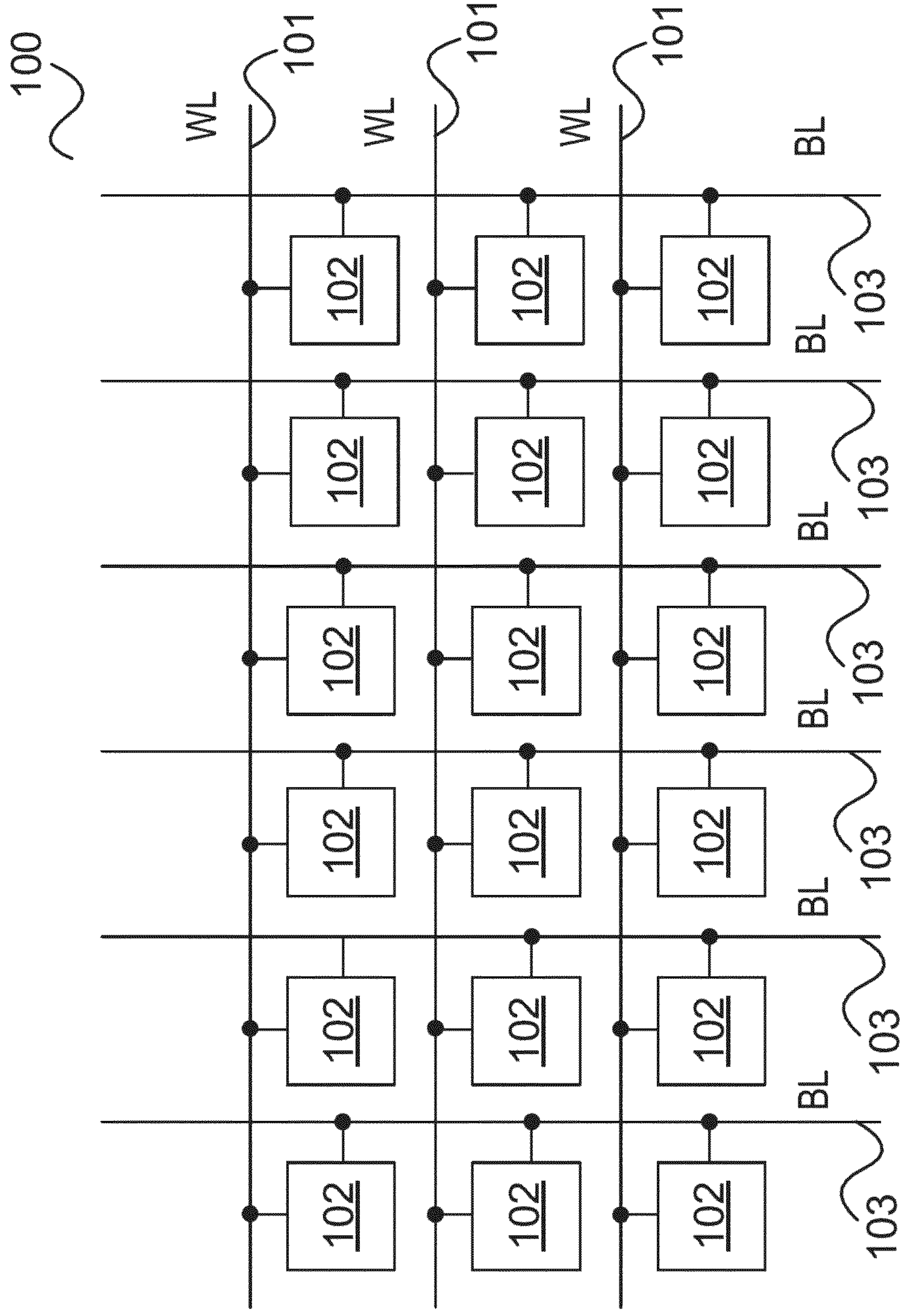
FIG. 1 shows a memory.

FIG. 1 shows a memory 100.

The memory 100 contains a memory array with a plurality of memory cells 102, wherein each memory cell 102 is connected to a respective word line 101 and a respective bit line 103.

Data can be stored in the memory cells 102 and read out from them again. Memory cells 102 of this kind can be realized on the basis of semiconductors in various technologies, for example flash, RRAM (resistive random access memory) or MRAM (magnetic RAM) technologies. All of these memory technologies have the common feature that, when reading out a memory cell 102, typically a read current (or readout current) is generated or measured, which read current flows in the bit line 103 to which the memory cell 102 that is to be read out is connected (in response to the fact that a certain voltage is applied to the memory cell 101). The word line 101 is used to address the memory cells 102 (in the illustration of FIG. 1 a row of memory cells 102) that are read out, that is to say that each provide a read current on a respective bit line.

In this case, there are at least two states of the read current; a lower current can represent a logical “0”, a higher current a logical “1”, for example. The aim of a memory readout circuit (traditionally referred to as a “read amplifier”) in this case is to measure the read current and to decide whether a logical “0” state or a logical “1” state exists, that is to say whether a 0 or a 1 was last stored in the memory cell 102.

One way to do this is to first convert the read current into a piece of time information by converting the current I or the flowing charge I*Δt into a voltage ΔU by means of a capacitance C. According to the capacitor formula $$C = \Delta Q/\Delta U = I^{*}\Delta T/\Delta U \text{ or } \Delta U = I^{*}\Delta t/C,$$

The voltage value ΔU increases with the Δt time. An example of this procedure is illustrated in FIG. 2.

Figure 2:
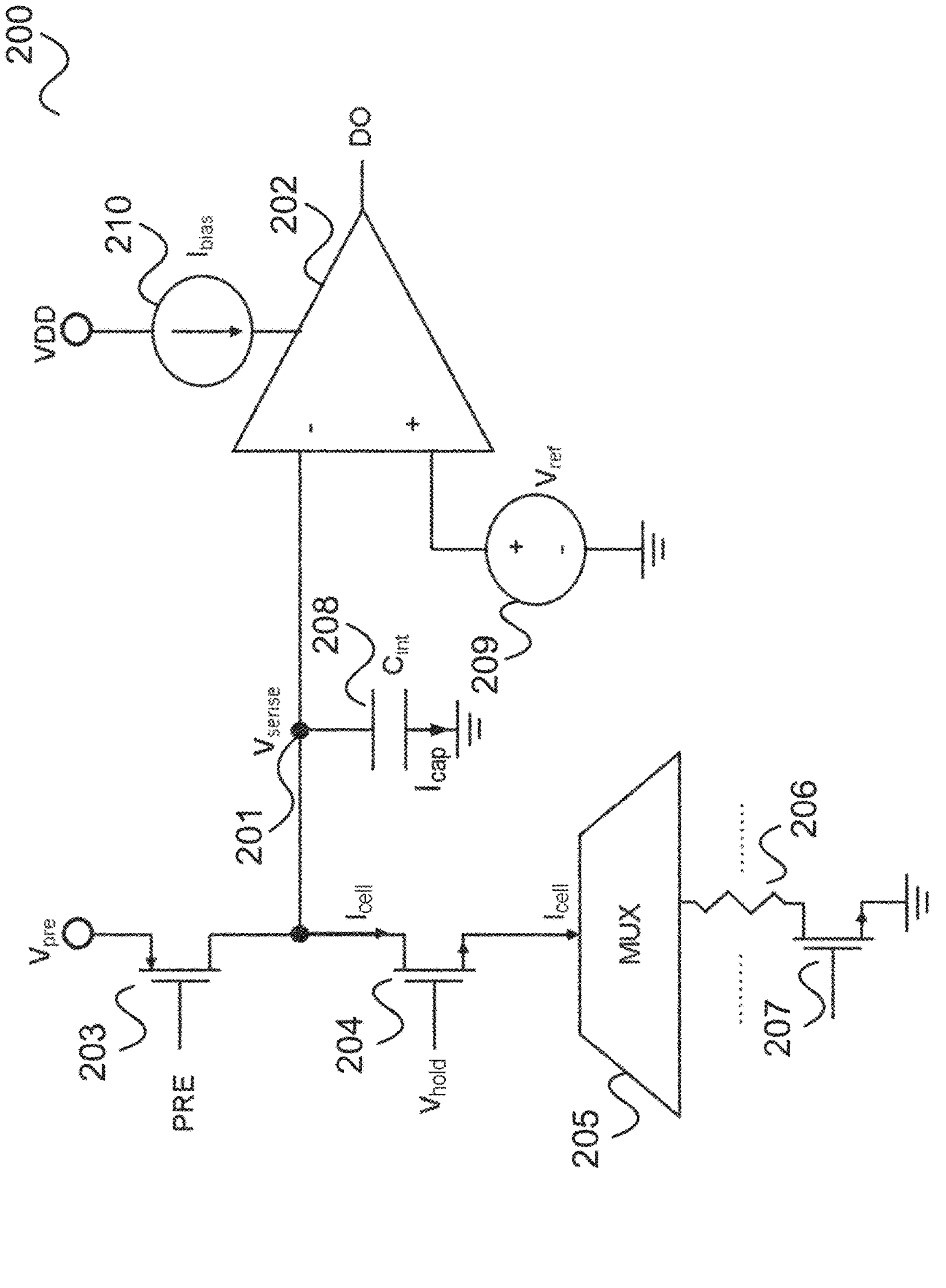
FIG. 2 shows a memory readout circuit.
Figure 3:
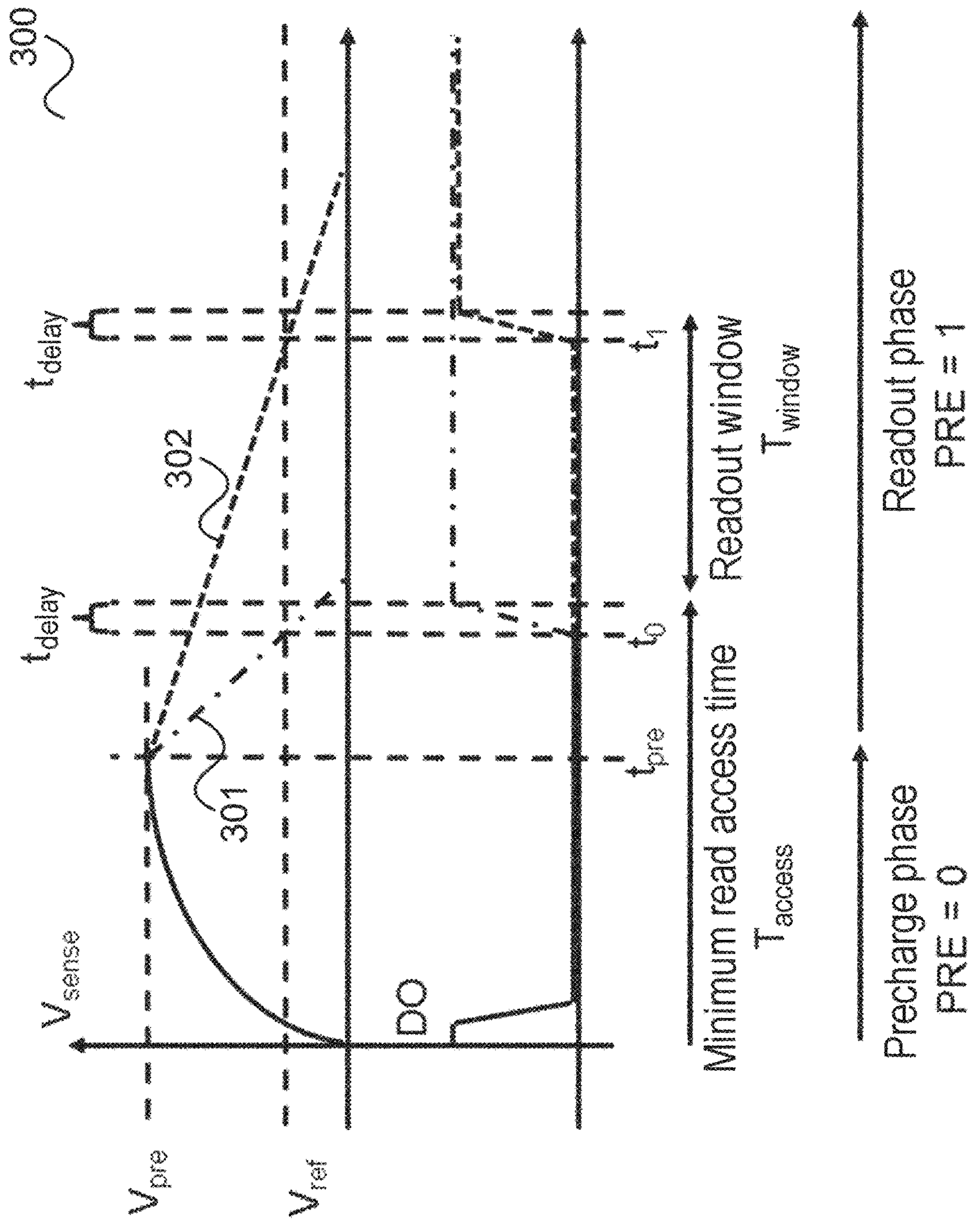
FIG. 3 shows the associated time graph for a readout process.

FIG. 2 shows an (integration-based) memory readout circuit 200 and FIG. 3 shows an associated time graph 300 for a readout process.

A readout node 201 of the memory readout circuit 200, which node is connected to a first input of a comparator 202, is charged via a first transistor 203 (in this case a p-channel field-effect transistor, for example a p-MOS (metal-oxide-semiconductor) transistor) to a voltage level $V_{pre}$ (pre-charge). A second transistor 204 (holding transistor, controlled by a voltage $V_{hold}$, in this case an n-channel field-effect transistor, for example an n-MOS transistor) and a multiplexer 205, which switches on the desired bit line (that is to say the bit line to which the memory cell to be read out is connected), is used to connect the readout node 201 to a terminal of the memory cell 206 to be read out, in this case represented by a resistor. A third (n-channel field-effect) transistor 207 is used to connect the other terminal of the memory cell to be read out to ground (that is to say the low supply potential).

Thus, at a time $t_{pre}$, a connection between the readout node 201 to ground is established via the memory cell 206, that is to say the readout phase is started (the control signal for the first transistor 203 is then set from 0 to 1, so that the pre-charging ends); thus, the read current $I_{cell}$ begins to flow and discharges an integration capacitance $C_{int}$ 208, so that the voltage at the readout node $V_{sense}$ starts to decrease continuously from Vpre (the integration capacitance 208 can be considered the capacitance of the readout node). As soon as the readout node 201 reaches the voltage level $V_{ref}$ (which is supplied by a reference voltage source 209, which is connected to the second input of the comparator 203), the comparator 202 switches over and the digital output DO of the comparator changes from a logical zero to a logical one. It is assumed that the memory cell is configured so that the read current is higher when it stores a zero (low resistance of the memory cell), and lower when it stores a one (high resistance of the memory cell). This results in a fast discharge curve 301 or a slow discharge curve 302, respectively, for these two cases. Accordingly, the inputs of comparator 203 when the memory cell stores a zero are earlier (at a time $t_0$) such that the comparator 203 switches over as if the memory cell stores a one (at a time $t_1$).

The minimum read access time $T_{access}$ is also indicated in graph 300. This is defined by the time $t_0$, which is given by the discharge current $I_{cell,0}$ when the memory cell stores a zero:

$$T_{access} = \text{pre-charge time} + \text{readout time for } I_{cell,0} = t_{pre} + C_{int} \times (V_{pre} - V_{ref})/I_{cell,0} + t_{delay} \quad (1)$$

The time $t_{delay}$ is in this case the delay of the comparator (that is to say the delay between the time at which the voltage at the readout node 201 becomes lower than $V_{ref}$ and the time at which DO jumps to one). This delay greatly depends on the bias current $I_{bias}$ of the comparator, represented in FIG. 2 by a bias current source 210.

The readout window $T_{window}$ is also marked in graph 300. The readout window of the (integration-based) readout process is defined by $t_1-t_0$ and thus corresponds to the difference between the cell current for a zero $I_{cell,0}$ and the cell current for a one $I_{cell,1}$:

$$T_{window} = (V_{pre} - V_{ref}) \times C_{int}(I_{cell,0} - I_{cell,1})/(I_{cell,0} \times I_{cell,1}) \quad (2)$$

The readout process should on the one hand have the lowest possible minimum read access time, so that it can be read out as quickly as possible, but on the other hand have the largest possible readout window in order to be robust against read errors and noise.

With regard to the read access time (see formula (1)), $T_{pre}$ is given by the memory area (bit line capacity) and technology parameters, and $I_{cell,0}$ is determined by the respective memory technology.

Thus, the only remaining design parameters to reduce the read access time are the voltage difference $V_{pre}-V_{ref}$ and $C_{int}$ (which must be reduced for this) and the delay $t_{delay}$.

With regard to the readout window (see formula (2)), $I_{cell,0}$ and $I_{cell,1}$ are determined by the respective memory technology.

Thus, the only remaining design parameter to extend the readout window are the voltage difference $V_{pre}-V_{ref}$ and $C_{int}$ (which must be reduced for this).

This results in a trade off between the readout time and the readout window: for a fixed comparator delay, it is not possible to shorten the readout time without shortening the readout window as well.

Figure 4:
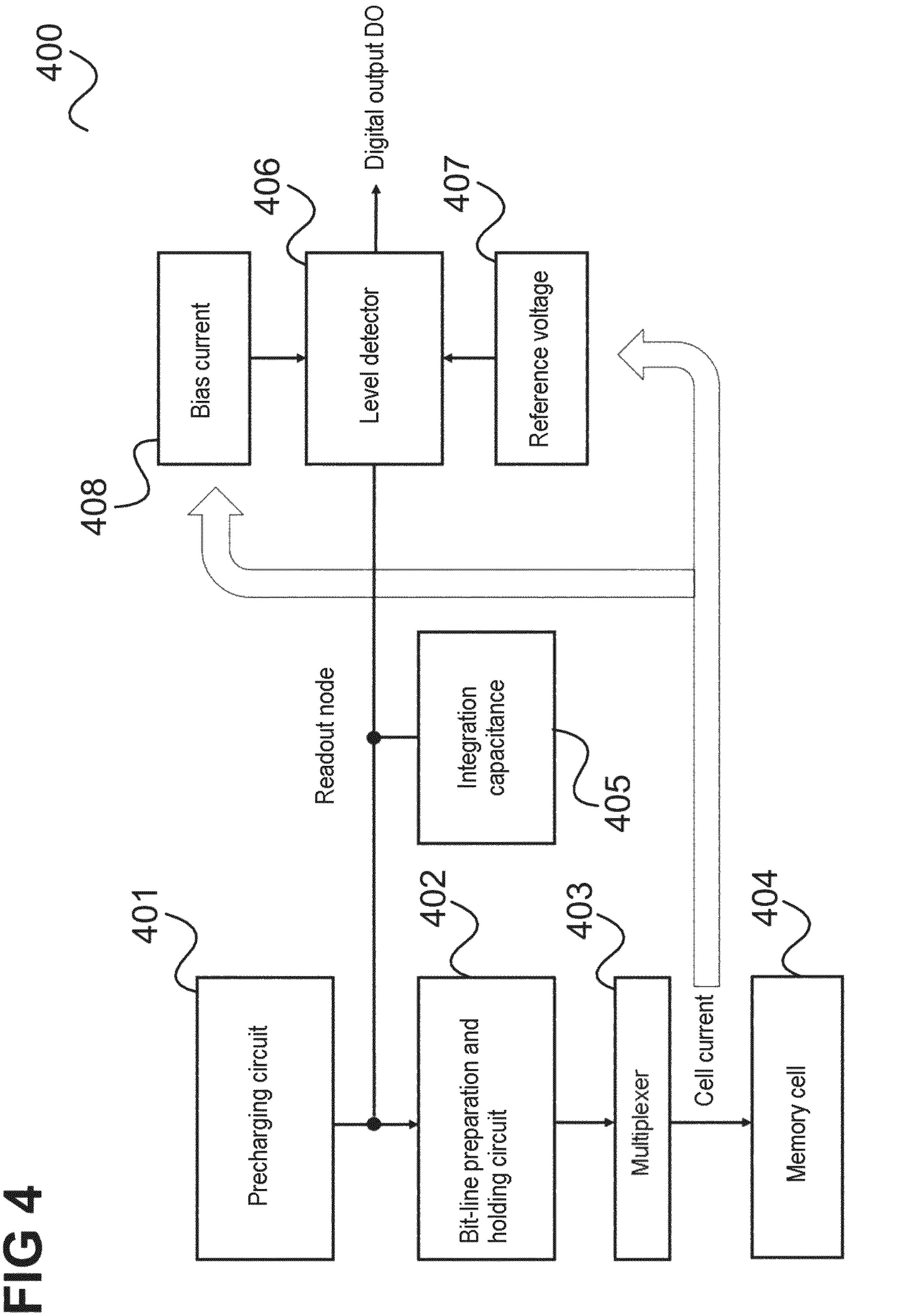
FIG. 4 shows a schematic illustration of a memory readout circuit arrangement.

FIG. 4 shows a schematic illustration of a memory readout circuit arrangement 400.

In accordance with the memory readout circuit 200, the memory readout circuit comprises a precharging circuit 401, a bit-line preparation and holding circuit 402, a multiplexer 403, a memory cell 404 (or is connected to this), an integration capacitance 405 and a comparator 406, which are connected to one another in the manner described in FIG. 2.

According to various embodiments, in order to both extend the readout window and keep the readout time low, the cell current is used to actively change the reference voltage 407 of the comparator and also the bias current 408 of the comparator. Specifically, in one exemplary embodiment, the reference voltage 407 and the bias current 408 are increased for a high cell current (that is to say a stored zero), so that the comparator switches faster for a stored zero. For a stored one (low cell current), the reference voltage 407 and the bias current 408 are not increased (but may even be decreased). This shortens the readout time and extends the readout window. This is also referred to below as active readout window extension.

Figure 5:
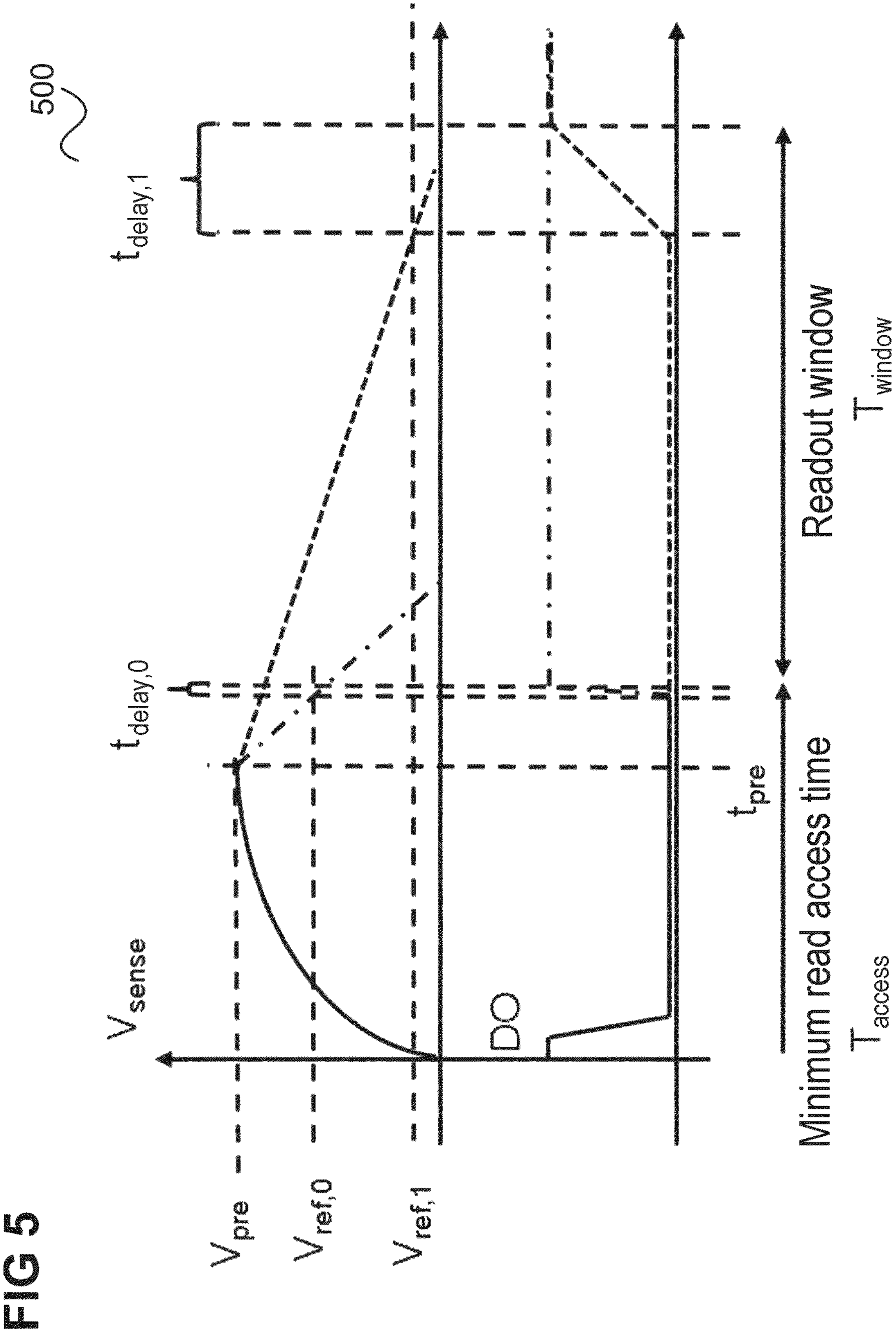
FIG. 5 shows a time graph in an active readout window extension according to one embodiment.

FIG. 5 shows a time graph 500 in the case of active readout window extension according to one embodiment.

In contrast to the time graph 200, the reference voltage for reading out a zero and a one is now not the same, but the reference voltage for reading out a zero $V_{ref,0}$ and is higher than the reference voltage for reading out a one $V_{ref,1}$. In addition, the bias current for reading out a zero is higher than for reading out a one, and thus the delay of the comparator for reading out a zero $t_{delay,0}$ is less than the delay of the comparator for reading out a one $t_{delay,1}$. This reduces the (minimum) readout time and extends the readout window.

The formulae thus take the place of the forms (1) and (2)

$$T_{access} = t_{pre} + C_{int} \times (V_{pre} - V_{ref,0})/I_{cell,0} + t_{delay,0} \quad (3)$$

or $$T_{window} = (V_{pre} - V_{ref,1}) \times C_{int}/I_{cell,1} - (V_{pre} - V_{ref,0}) \times C_{int}/I_{cell,0} + t_{delay,1} - t_{delay,0} \quad (4)$$

The following text describes memory readout circuits in which $V_{ref}$ and $I_{bias}$ are variable and depend on the cell current as described above, that is to say provision is made of a control circuit that sets $V_{ref}$ and $I_{bias}$ depending on the cell current. According to various embodiments, $V_{ref}$ and $I_{bias}$ are used depending on the charging (or discharge) current by the capacitance $I_{cap}=I_{cell}$ (see FIG. 2), that is to say $I_{cap}$ is tapped (or measured) by a corresponding circuit and $V_{ref}$ and $I_{bias}$ are set or changed accordingly.

Figure 6:
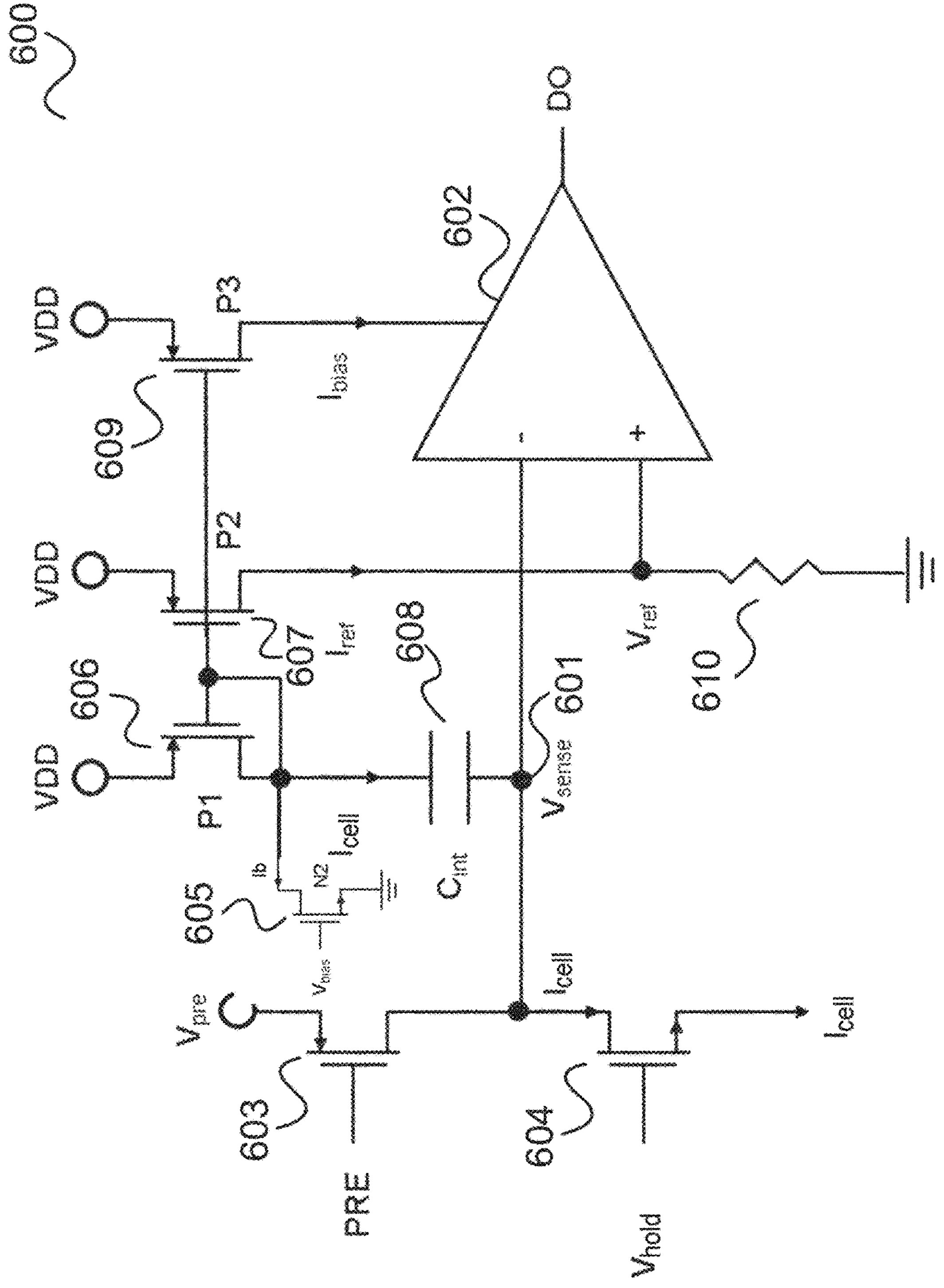
FIG. 6 shows a memory readout circuit according to one embodiment.

FIG. 6 shows a memory readout circuit 600 according to one embodiment.

The memory readout circuit 600 is an example of a circuit in which the cell current is measured at the integration capacitance (based on the discharge current of the integration capacitance in the readout phase) and, on this basis, the bias current and/or the reference voltage of the comparator (in the case of the circuit 600, both) are set variably.

Like the memory readout circuit 200 from FIG. 2, the memory readout circuit 600 contains a first transistor 603 (pre-charge transistor), a second transistor 604 (holding transistor), which are connected via a readout node 601, a comparator 602 and an integration capacitance 608, which is connected to the readout node 601 by way of its first terminal and is connected to ground by way of its second terminal via a third (n-channel field-effect) transistor 605, which functions as a constant bias current source $I_b$ for defining the operating point of a fourth transistor 606. This second terminal of the integration capacitance is further connected to the drain of the fourth (p-channel field-effect) transistor 606.

The fourth transistor 606 together with a fifth (p-channel field-effect) transistor 607 forms a first current mirror, which provides a reference current $I_{ref}$, and together with a sixth (p-channel field-effect) transistor 609 forms a second current mirror, which supplies the bias current $I_{bias}$ to the comparator 602. The fourth transistor 606 is therefore used as a current measuring element and controls the currents $I_{bias}$ and $I_{ref}$.

The reference voltage $V_{ref}$ is given by the voltage that drops at a resistor 610 through which the reference current $I_{ref}$ flows (to ground).

If the cell current $I_{cell}$ flows through the memory cell after the pre-charge phase, the integration capacitance is discharged with this current $I_{cell}$ via the fourth transistor 606. This measures the cell current and $V_{ref}$ (that is to say as a product of the reference current $I_{ref}$ and the value of the resistor 610) and $I_{bias}$ are set via the two current mirrors depending on this cell current. Thus, the switching threshold and the switching speed of the comparator 602 (which is used as a level detector) depend on the cell current.

Therefore, as described with reference to FIG. 4 and FIG. 5, in the memory readout circuit 600, $V_{ref}$ and $I_{bias}$ depend on the cell current.

The control circuit that implements this dependency contains, in particular, the two current mirrors and the resistor 610.

Figure 7:
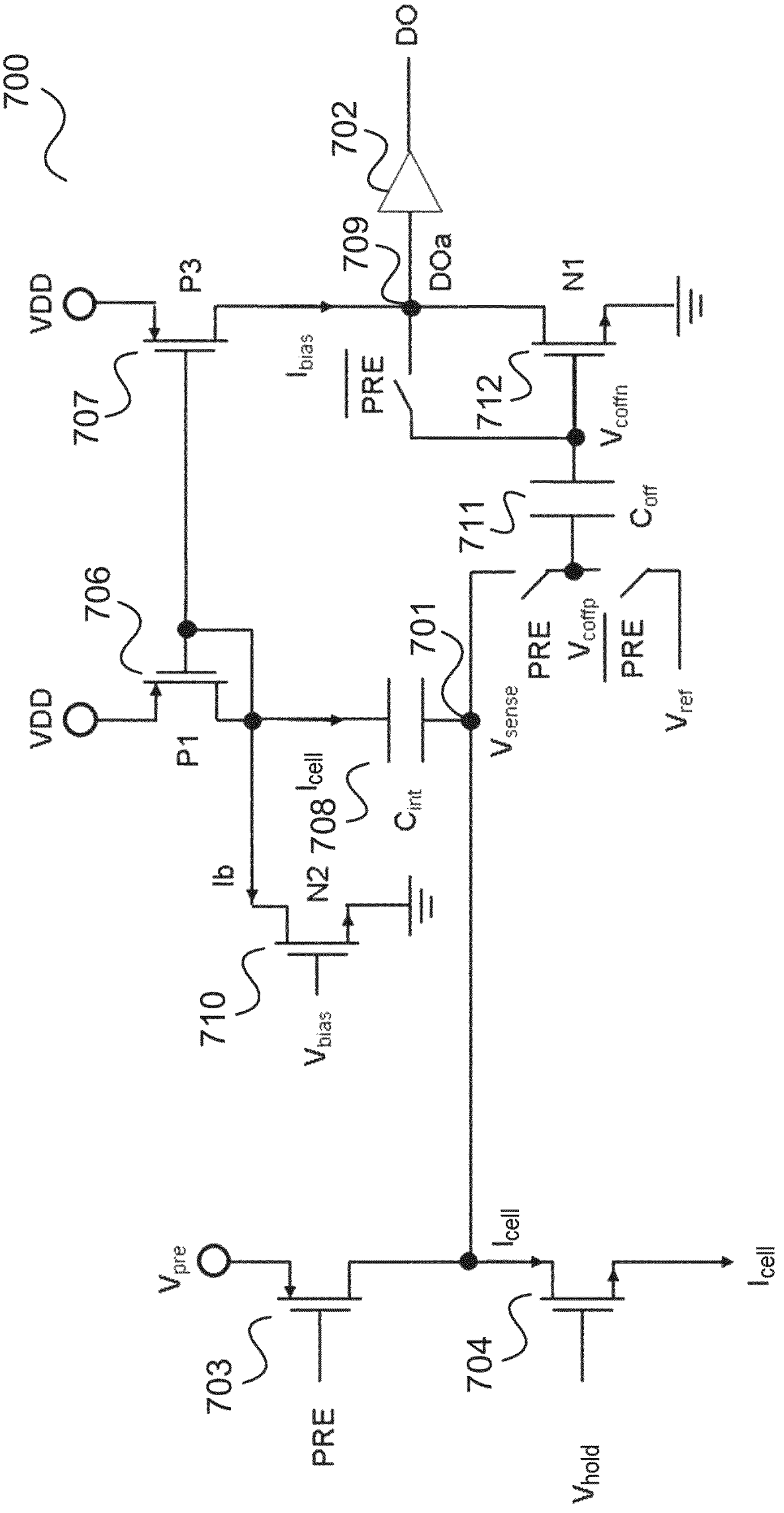
FIG. 7 shows a memory readout circuit.
Figure 8:
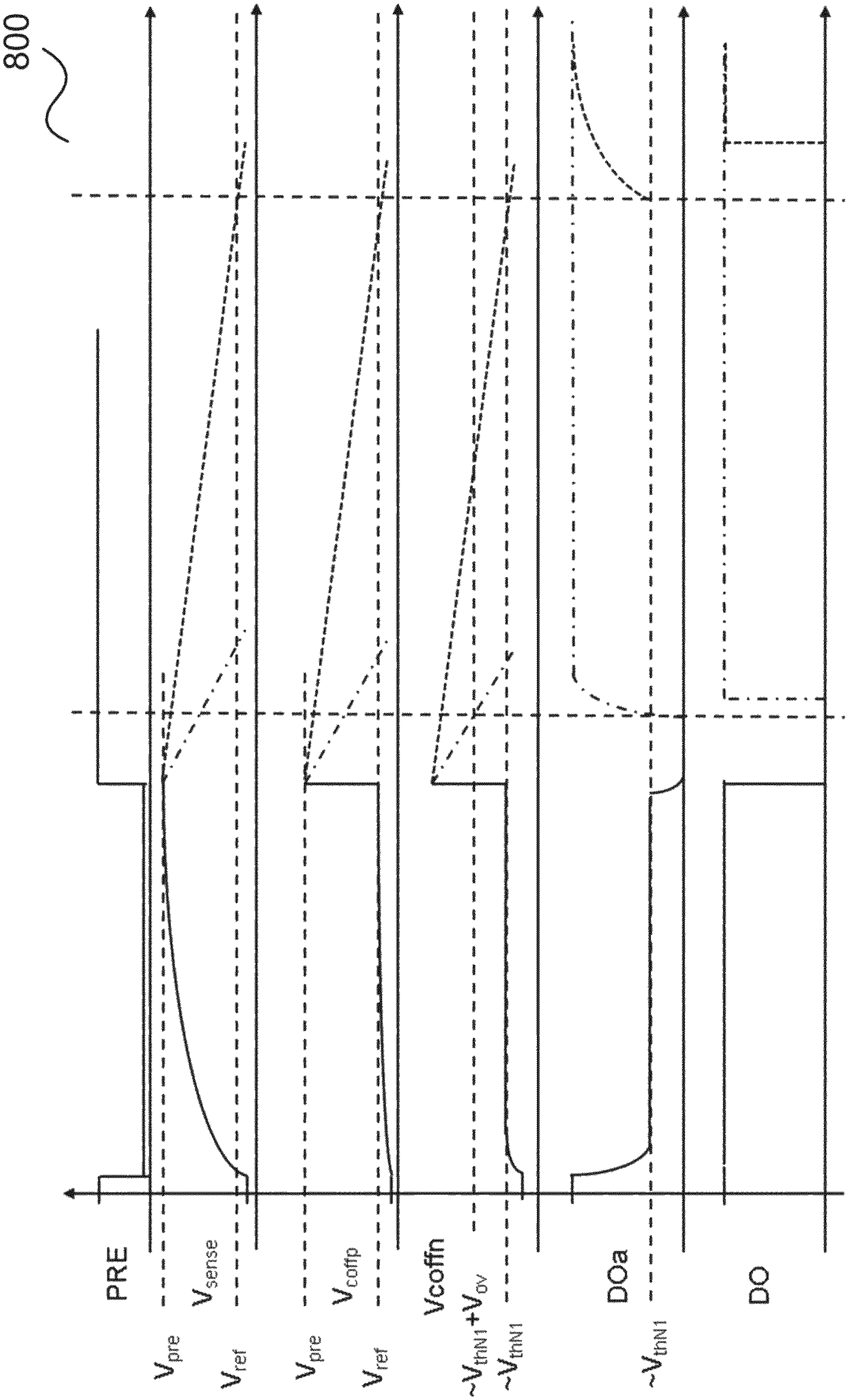
FIG. 8 shows the associated time graph for a readout process.

FIG. 7 shows a memory readout circuit 700 and FIG. 8 shows an associated time graph 800 for a readout process according to a further embodiment.

Like the memory readout circuit 200 from FIG. 2, the memory readout circuit 700 contains a first transistor 703 (pre-charge transistor), a second transistor 704 (holding transistor), which are connected via a readout node 701, and a comparator (in this case in the form of a seventh (n-channel field-effect) transistor 712, see below), and an integration capacitance 708, which is connected to the readout node 701 by way of its first terminal (multiplexer and memory cell are omitted here for the sake of simplicity).

The second terminal of the integration capacitance is furthermore connected to the drain of a fourth (p-channel field-effect) transistor 706.

The fourth transistor 706 together with a fifth (p-channel field-effect) transistor 707 forms a second current mirror, which provides a bias current $I_{bias}$ to the input node 709 of the inverter 702. The fourth transistor 706 is therefore used as a current measuring element and controls the current $I_{bias}$.

The second terminal of the integration capacitance 708 is furthermore connected to the drain of a sixth (n-channel field-effect) transistor 710, the source of which is connected to ground (that is to say the low supply potential).

The sixth transistor 710 receives a bias voltage $V_{bias}$ as the input voltage at its gate, which causes, in the pre-charge phase, that is to say when $I_{cell}$ is equal to zero, the current mirror to still reflect a certain bias current $I_b$, that is to say, in the pre-charge phase, the bias current $I_{bias}$ is equal to $I_b$.

In the pre-charge phase, that is to say PRE is active (which in this example corresponds to a low level of PRE), the pre-charge voltage $V_{pre}$ is connected to the readout node 701 via the first transistor 703 and the second terminal of the integration capacitance 708 is connected to ground via the third transistor 704, such that, as in the examples above, the integration capacitance 708 is charged.

In addition, when PRE is active (and therefore $\overline{PRE}$ is high), the first terminal (the potential of which is referred to as $V_{coffp}$) of a compensating capacitance (or offset capacitance) 711 is connected to a voltage $V_{ref}$, the second terminal (the potential of which is referred to as $V_{coffn}$) is connected to the gate of a seventh (n-channel field-effect) transistor 712, the source of which is connected to ground and the drain of which is connected to inverter input node 709. In the pre-charge phase ($\overline{PRE}$ is high), the drain of the seventh transistor 712 is also connected to its gate, that is to say the seventh transistor 712 is connected as a diode. Accordingly, the threshold voltage VthN1 thereof drops across it in the pre-charge phase. The balancing capacitance 711 is therefore charged to VthN1−$V_{ref}$ in the pre-charge phase. (The overdrive voltage of the seventh transistor 712 is denoted by $V_{ov}$.) The switches shown can be implemented using additional field-effect transistors (p-channel or n-channel). In the example shown, it is assumed that they are closed when the signal (PRE or $\overline{PRE}$) given next to them is high.

In the readout phase (PRE is now high, that is to say $\overline{PRE}$ is low), the first terminal of the readout capacitance is connected to the readout node 701 (and isolated from $V_{ref}$). Likewise, the gate of the seventh transistor 712 is isolated from the drain thereof. The integration capacitance 708 is now charged via the current mirror, so that the voltage at the readout node $V_{sense}$ continuously decreases starting from $V_{pre}$, where the larger the cell current $I_{cell}$, the greater the bias current $I_{bias}$.

If the voltage at the readout node (after a time that depends on the level of the cell current $I_{cell}$) has dropped so far that the seventh transistor 712 blocks, the voltage at the input node DOa of the inverter 702 increases and the inverter 702 switches so that the output signal DO of the inverter 702 assumes a high level. In the case of a high cell current, $I_{bias}$ is higher and, on the one hand, the node DOa is charged faster and, on the other hand, the switching threshold is changed to VthN1+Vov, from which the node DOa begins to increase.

The circuit 700 achieves a situation in which a possible variation of the threshold voltage VthN1 of the seventh transistor 712 is compensated.

In addition, as with circuit 600 in FIG. 6, the switching threshold and the switching speed of the level detector (in this case with the seventh transistor 712 as central component) depends on the cell current. The control circuit that implements this dependency contains the current mirror, in particular.

Since the integration capacitance 708 is connected to VDD during discharge, the reading of noise in the supply voltage is adversely affected. To avoid this, the sources of the fourth transistor and the fifth transistor can also be supplied with the pre-charge voltage $V_{pre}$ (instead of VDD) (which is stabilized by a preregulation process, for example).

Figure 9:
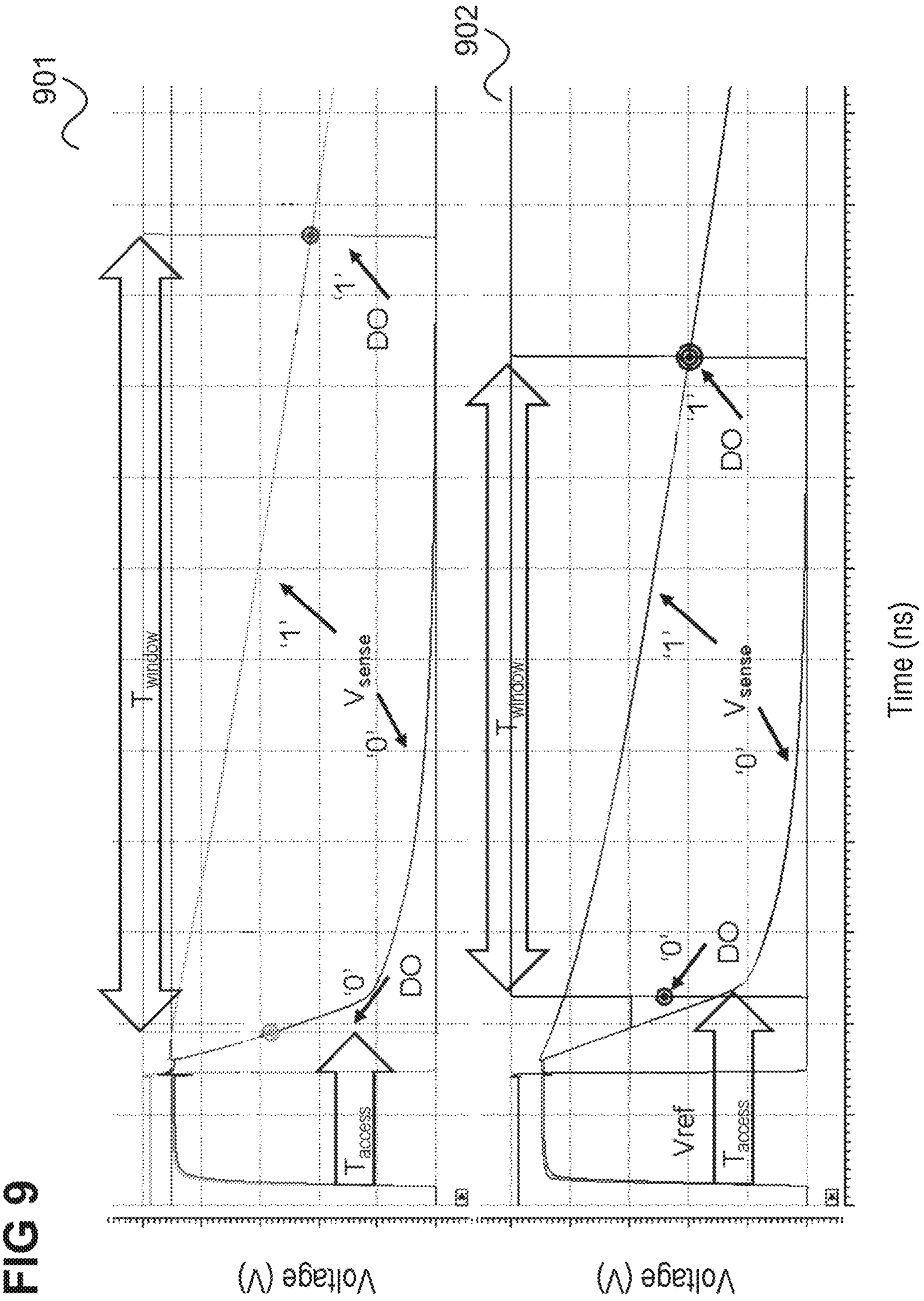
FIG. 9 shows a comparison of a readout process with active readout window extension and without active readout window extension.

FIG. 9 shows a comparison of a readout process with active readout window extension as in the circuits of FIG. 6 and FIG. 7 (upper graph 901) and without active readout window extension as in the circuit of FIG. 2 (lower graph 902). With active readout window extension, the readout window $T_{window}$ can be extended by approximately 25% and the time taken to read out a zero can be significantly reduced. As a result, greater robustness against process fluctuations can be achieved with active readout window extension.

In the above examples of circuits with active readout window extension, the cell current is determined by measuring the discharge current of the readout capacitance. It is also possible that the readout capacitance is divided and only the discharge current is measured at one of the two partial capacitances. An example of this is shown in FIG. 10.

Figure 10:
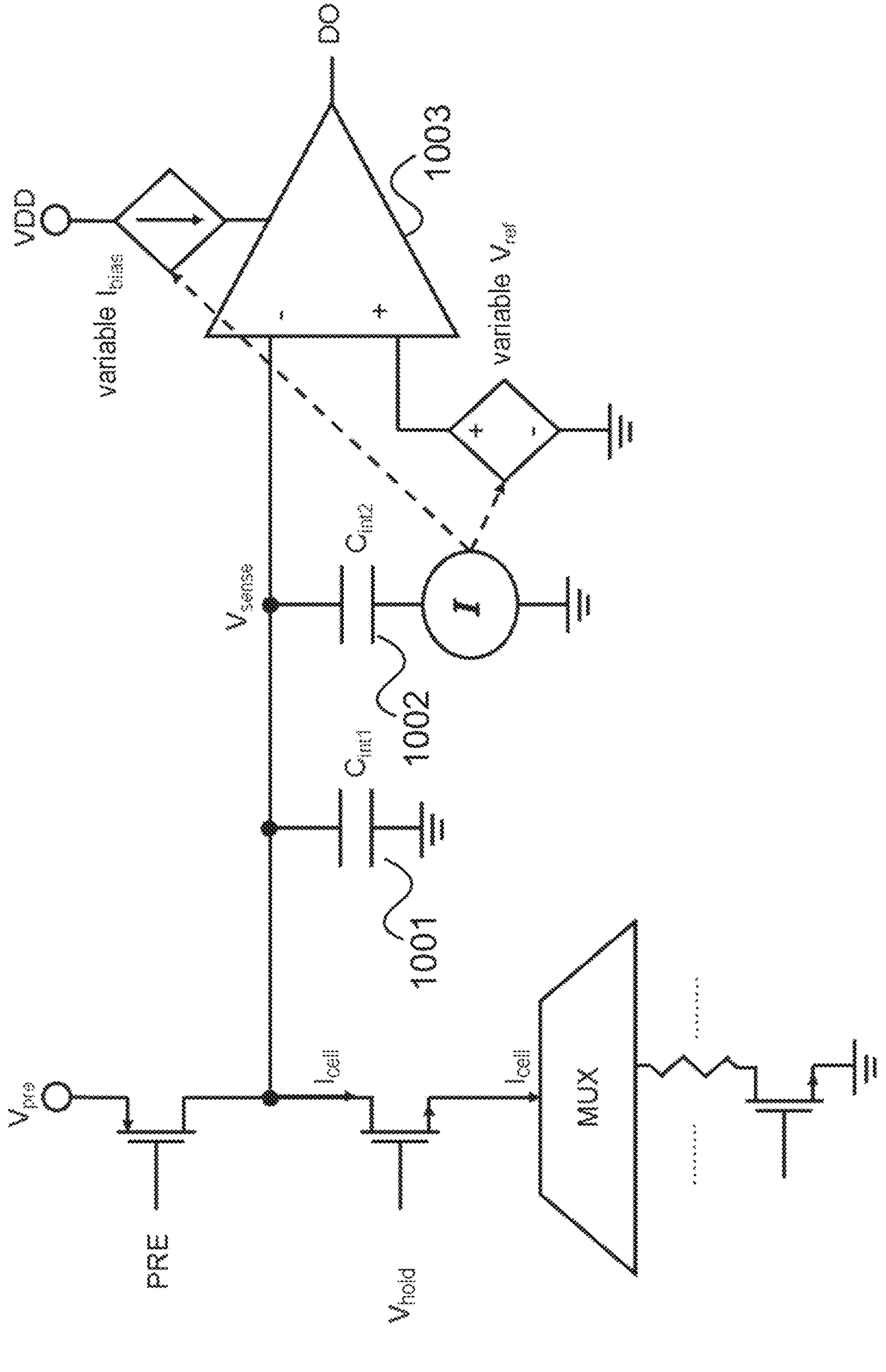
FIG. 10 shows a memory readout circuit according to another embodiment.

FIG. 10 shows a memory readout circuit 1000 according to another embodiment.

In this example, there are two integration capacitances 1001, 1002 and the discharge current of the second integration capacitance 1002 is measured and, based on this, the bias current and the reference voltage for the comparator 1003 are set. Otherwise, the function is the same as for the circuit of FIG. 2.

Figure 11:
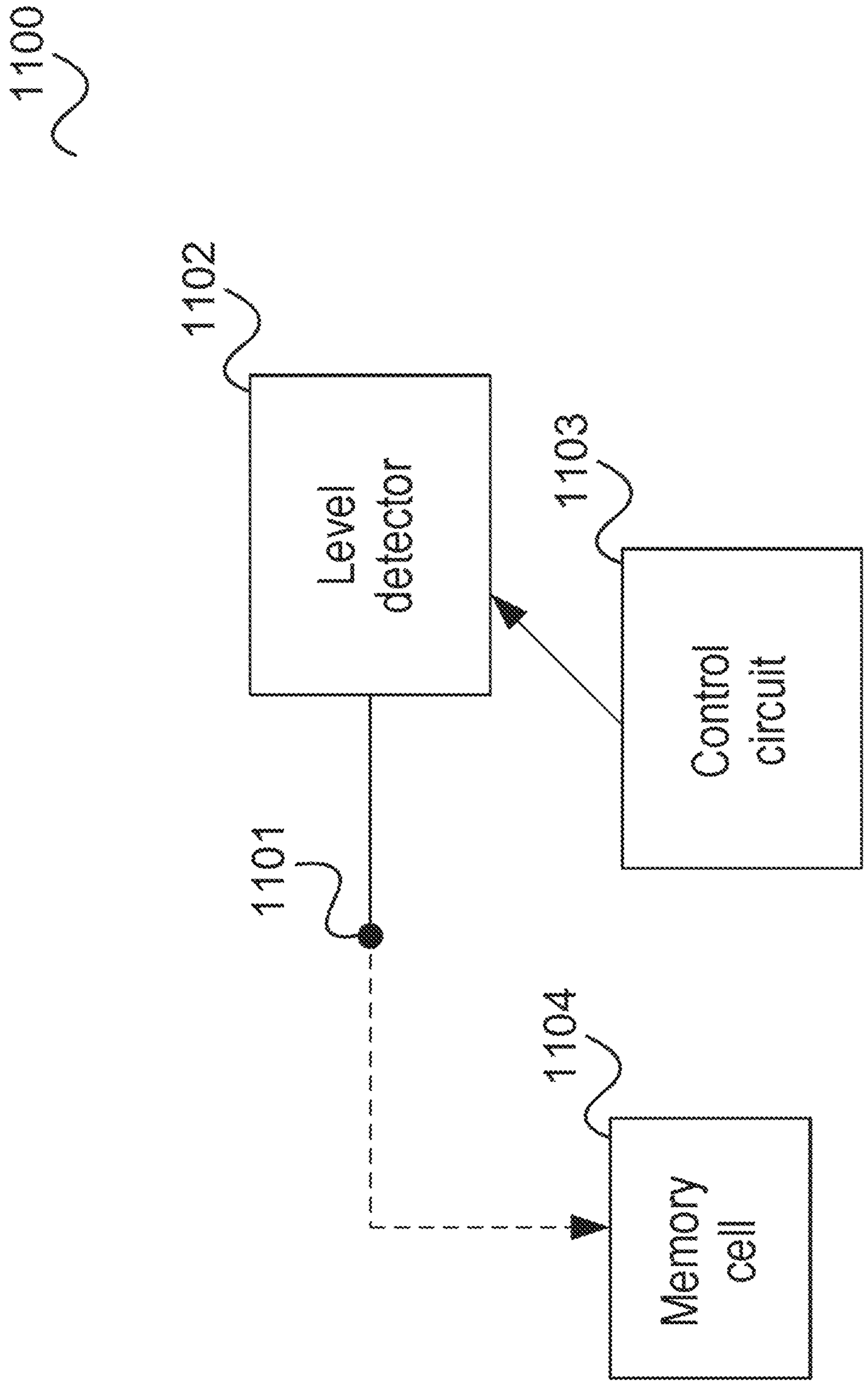
FIG. 11 shows a memory readout circuit according to one embodiment.

In summary, according to various embodiments, provision is made for a memory readout circuit as illustrated in FIG. 11.

FIG. 11 shows a memory readout circuit 1100 according to one embodiment.

The memory readout circuit 1100 contains a readout node 1101 having a capacitance that is discharged by the memory cell 1104 to read out a memory cell 1104 by means of a cell current.

The memory readout circuit 1100 also contains a level detector 1102 that is configured to provide a digital output signal and to switch over the output signal when the potential of the readout node (due to the discharge of the readout node) crosses a switching threshold (depending on the selection of the level and the polarity downward or upward, that is to say the switching threshold is overshot or undershot), and a control circuit that is configured to set the switching threshold and/or the switching speed of the level detector depending on the cell current.

According to various embodiments, for example, the reference voltage (and thus the switching threshold) and the bias current (and thus the switching speed) of a comparator are actively changed in order to extend the readout window and reduce the access time. This is done, for example, by measuring the current flowing through the integration capacitance in the readout phase and, depending on this, setting the reference voltage and the bias current of the comparator (or generally the switching threshold and the switching speed of the level detector).

According to one embodiment, a memory is provided, comprising a plurality of memory cells and at least one memory readout circuit according to one of the embodiments specified herein, wherein the memory cell that is read out is one of the plurality of memory cells.

Various exemplary embodiments are stated below.

Exemplary embodiment 1 is a memory readout circuit as described with reference to FIG. 11.

Exemplary embodiment 2 is a memory readout circuit according to exemplary embodiment 1, wherein the control circuit is configured to set the switching speed to be higher, the higher the cell current is.

Exemplary embodiment 3 is a memory readout circuit according to exemplary embodiment 1 or 2, wherein the crossing is an undershooting and the control circuit is configured to set the switching speed to be higher, the higher the cell current is.

Exemplary embodiment 4 is a memory readout circuit according to exemplary embodiment 1 or 2, wherein the crossing is an overshooting and the control circuit is configured to set the switching speed to be lower, the higher the cell current is.

Exemplary embodiment 5 is a memory readout circuit according to any one of exemplary embodiments 1 to 4, wherein the control circuit is configured to set the switching speed of the level detector by setting a bias current of the level detector.

Exemplary embodiment 6 is a memory readout circuit according to any one of exemplary embodiments 1 to 5, wherein the level detector is a comparator.

Exemplary embodiment 7 is a memory readout circuit according to exemplary embodiment 6, wherein the control circuit is configured to set the switching threshold by setting a reference voltage with which the comparator compares the potential of the readout node.

Exemplary embodiment 8 is a memory readout circuit according to any one of exemplary embodiments 1 to 6, wherein the level detector has an inverter whose input node potential is switched depending on the potential of the readout node.

Exemplary embodiment 9 is a memory readout circuit according to any one of exemplary embodiments 1 to 8, wherein the control circuit is configured to measure the discharge current with which the capacitance is discharged, and to set the switching threshold and/or the switching speed depending on the measured discharge current.

Exemplary embodiment 10 is a memory readout circuit according to any one of exemplary embodiments 1 to 9, wherein the control circuit has at least one current mirror, which is configured to mirror the discharge current with which the capacitance is discharged, and wherein the control circuit is configured to supply the mirrored current to the level detector as a bias current and/or to supply the voltage drop of the mirrored current at a resistor to the level detector as the switching threshold.

Exemplary embodiment 11 is a memory, comprising a plurality of memory cells and at least one memory readout circuit according to any one of exemplary embodiments 1 to 10.

Although the invention has been shown and described primarily with reference to specific embodiments, it should be understood by those familiar with the technical field that numerous modifications may be made with regard to configuration and details thereof, without departing from the essence and scope of the invention as defined by the claims hereinafter. The scope of the invention is therefore determined by the appended claims, and the intention is for all modifications to be encompassed which come under the literal meaning or the scope of equivalence of the claims.

What is claimed is:

1. A memory readout circuit configured to read a data state from a memory cell, the memory readout circuit comprising:

a readout node having a capacitance that is discharged by the memory cell to read out the data state from the memory cell by means of a cell current;

a level detector that is set up to provide a digital output signal and to switch a state of the digital output signal when a potential of the readout node crosses a switching threshold; and a control circuit that is configured to set the switching threshold and/or a switching speed of the level detector depending on the cell current.

2. The memory readout circuit as claimed in claim 1, wherein the control circuit is configured to increase the switching speed with an increase in the cell current.

3. The memory readout circuit as claimed in claim 2, wherein the potential of the readout node crosses the switching threshold when the potential undershoots the switching threshold.

4. The memory readout circuit as claimed in claim 1, wherein the potential of the readout node crosses the switching threshold when the potential overshoots the switching threshold, and wherein the control circuit is configured to decrease the switching speed with an increase in the cell current.

5. The memory readout circuit as claimed in claim 1, wherein the control circuit is configured to set the switching speed of the level detector by setting a bias current of the level detector.

6. The memory readout circuit as claimed in claim 1, wherein the level detector is a comparator.

7. The memory readout circuit as claimed in claim 6, wherein the control circuit is configured to set the switching threshold by setting a reference voltage with which the comparator compares the potential of the readout node.

8. The memory readout circuit as claimed in claim 1, wherein the level detector includes an inverter whose input node potential is switched depending on the potential of the readout node.

9. The memory readout circuit as claimed in claim 1, wherein the control circuit is configured to measure the discharge current with which the capacitance is discharged, and is configured to set the switching threshold and/or the switching speed depending on the measured discharge current.

10. The memory readout circuit as claimed in claim 1, wherein the control circuit includes at least one current mirror, which is configured to mirror the discharge current with which the capacitance is discharged, and wherein the control circuit is configured to supply the mirrored current to the level detector as a bias current and/or to supply a voltage drop of the mirrored current at a resistor to the level detector as the switching threshold.

11. A memory, comprising a plurality of memory cells and at least one memory readout circuit as claimed in claim 1.

12. A memory device, comprising:

a memory cell;

a bitline coupled to the memory cell;

a comparator having a first input, a second input, and an output;

a first transistor having a first terminal, a second terminal, and a control terminal, the first terminal of the first transistor being coupled to a supply voltage terminal, and the second terminal of the first transistor being coupled to the first input of the comparator;

a second transistor having a first terminal, a second terminal, and a control terminal, the first terminal of the second transistor being coupled to the second terminal of the first transistor and being coupled to the first input of the comparator, and the second terminal of the second transistor being coupled to the bitline;

a third transistor having a first terminal, a second terminal, and a control terminal, the first terminal of the third transistor being coupled to a capacitance, the capacitance being coupled to the first input of the comparator; and a fourth transistor having a first terminal, a second terminal, and a control terminal, the control terminal of the fourth transistor being coupled to the first terminal of the third transistor and being coupled to the second terminal of the fourth transistor.

13. The memory device of claim 12, wherein the second terminal of the third transistor is coupled to a ground terminal and the control terminal of the third transistor is coupled to a constant voltage bias terminal.

14. The memory device of claim 13, further comprising:

a fifth transistor having a first terminal, a second terminal, and a control terminal, the control terminal of the fifth transistor being coupled to the control terminal of the second transistor and the second terminal of the fifth transistor being coupled to the second input of the comparator.

15. The memory device of claim 14, further comprising a resistor having a first terminal and a second terminal, the first terminal of the resistor coupled to the second input of the comparator and being coupled to the second terminal of the fifth transistor, and the second terminal of the resistor coupled to a ground terminal.

16. The memory device of claim 14, wherein the comparator further comprises a bias current input terminal, and further comprising:

a sixth transistor having a first terminal, a second terminal, and a control terminal, the control terminal of the sixth transistor being coupled to the control terminals of the fourth and fifth transistors, and the second terminal of the sixth transistor being coupled to the bias current input terminal of the comparator.

17. The memory device of claim 16, wherein the first terminal of the fourth transistor, the first terminal of the fifth transistor, and the first terminal of the sixth transistor are each coupled to a DC supply terminal.

18. The memory device of claim 12, where the first transistor is a PMOS transistor and the second transistor is an NMOS transistor.

19. The memory device of claim 12, where the third transistor is an NMOS transistor and the fourth transistor is a PMOS transistor.

20. The memory device of claim 14, wherein the comparator includes an inverter having an input and an output, the input of the inverter being coupled to the second terminal of the fifth transistor.

* * * * *